(12) United States Patent
Jeanrenaud et al.

(10) Patent No.: US 11,977,356 B2
(45) Date of Patent: May 7, 2024

(54) EXTERNAL ELEMENT OR DIAL FOR HOROLOGY OR JEWELLERY MADE OF CONDUCTIVE MATERIAL

(71) Applicant: OMEGA SA, Biel/Bienne (CH)

(72) Inventors: Frederic Jeanrenaud, La Chaux-de-Fonds (CH); Gregory Kissling, La Neuveville (CH)

(73) Assignee: OMEGA SA, Biel/Bienne (CH)

( * ) Notice: Subject to any disclaimer, the term of this patent is extended or adjusted under 35 U.S.C. 154(b) by 880 days.

(21) Appl. No.: 16/816,309

(22) Filed: Mar. 12, 2020

(65) Prior Publication Data
US 2020/0292996 A1 Sep. 17, 2020

(30) Foreign Application Priority Data

Mar. 14, 2019 (EP) .................................... 19162928

(51) Int. Cl.
| | |
|---|---|
| *G04B 45/00* | (2006.01) |
| *A44C 27/00* | (2006.01) |
| *C23C 14/58* | (2006.01) |
| *G04B 19/10* | (2006.01) |
| *G04B 19/12* | (2006.01) |

(Continued)

(52) U.S. Cl.
CPC ........ *G04B 45/0076* (2013.01); *A44C 27/006* (2013.01); *C23C 14/5873* (2013.01); *G04B 19/10* (2013.01); *G04B 19/12* (2013.01); *G04D 3/0069* (2013.01); *G04D 3/0092* (2013.01); *C23C 14/081* (2013.01); *C23C 14/087* (2013.01)

(58) Field of Classification Search
None
See application file for complete search history.

(56) References Cited

U.S. PATENT DOCUMENTS

| | | |
|---|---|---|
| 2015/0049593 A1 | 2/2015 | Oliveira |
| 2015/0122774 A1 | 5/2015 | Fernandez Ciurleo et al. |
| 2016/0263698 A1 | 9/2016 | Noirot et al. |

(Continued)

FOREIGN PATENT DOCUMENTS

| | | |
|---|---|---|
| CH | 711 958 A2 | 6/2017 |
| CN | 1198368 A | 11/1998 |

(Continued)

OTHER PUBLICATIONS

Combined Chinese Office Action and Search Report dated Apr. 28, 2021 in Chinese Patent Application No. 202010175951.8 (with English translation of Office Action), 17 pages.

(Continued)

*Primary Examiner* — Michael P. Rodriguez
(74) *Attorney, Agent, or Firm* — Oblon, McClelland, Maier & Neustadt, L.L.P.

(57) ABSTRACT

A method for fabricating a timepiece component made of conductive material includes: making a base from conductive material; coating the base with a first layer of sacrificial metal protection material; etching a recessed decoration mechanically or with a laser; coating the first recessed decoration and the remaining part of the first layer with a second metal and/or coloured decorative treatment layer; and removing each first sacrificial metal protection layer by chemical devices, to obtain a blank including a first decoration formed by the remaining part of the second layer.

32 Claims, 4 Drawing Sheets

(51) Int. Cl.
*G04D 3/00* (2006.01)
*C23C 14/08* (2006.01)

(56) References Cited

U.S. PATENT DOCUMENTS

2017/0038734 A1   2/2017  Issartel et al.
2019/0302697 A1*  10/2019 Larriere ................... C23F 1/00

FOREIGN PATENT DOCUMENTS

| CN | 102233702 A | 11/2011 | | |
|----|----|----|----|----|
| CN | 108366652 A | 8/2018 | | |
| EP | 0 459 461 A1 | 12/1991 | | |
| EP | 0459461 A1 * | 12/1991 | | |
| EP | 2 380 864 B1 | 11/2013 | | |
| EP | 3 181 006 A1 | 6/2017 | | |
| EP | 3 336 614 A1 | 6/2018 | | |
| JP | 4-41679 A | 2/1992 | | |
| JP | 4-136188 A | 5/1992 | | |
| JP | 4-160154 A | 6/1992 | | |
| JP | 5-156425 A | 6/1993 | | |
| JP | 11-256364 A | 9/1999 | | |
| JP | 2002-196086 A | 7/2002 | | |
| JP | 2003-222686 A | 8/2003 | | |
| TW | 201830175 A | 8/2018 | | |
| WO | WO 02/37193 A1 | 5/2002 | | |
| WO | WO-2018109065 A1 * | 6/2018 | ............. | B44C 1/228 |

OTHER PUBLICATIONS

Indian Office Action dated May 19, 2021 in Indian Patent Application No. 202044010213, 5 pages.
Japanese Office Action dated Feb. 2, 2021 in Japanese Patent Application No. 2020-038440 (with English translation), 14 pages.
Russian Office Action dated Oct. 13, 2020 in Russian Patent Application No. 2020110364 (with English translation), 11 pages.
Combined Taiwanese Office Action and Search Report dated Oct. 25, 2021 in corresponding Taiwanese Patent Application No. 109105615 (with English Translation), 18 pages.
European Search Report dated Oct. 15, 2019 in European Application 19162928.6, filed on Mar. 14, 2019 (with English Translation of categories of Cited Documents), 3 pages.
Notification under Article 94(3) EPC dated Feb. 9, 2024, issued in European Patent Application No. 19162928.6 (with English translation).

* cited by examiner

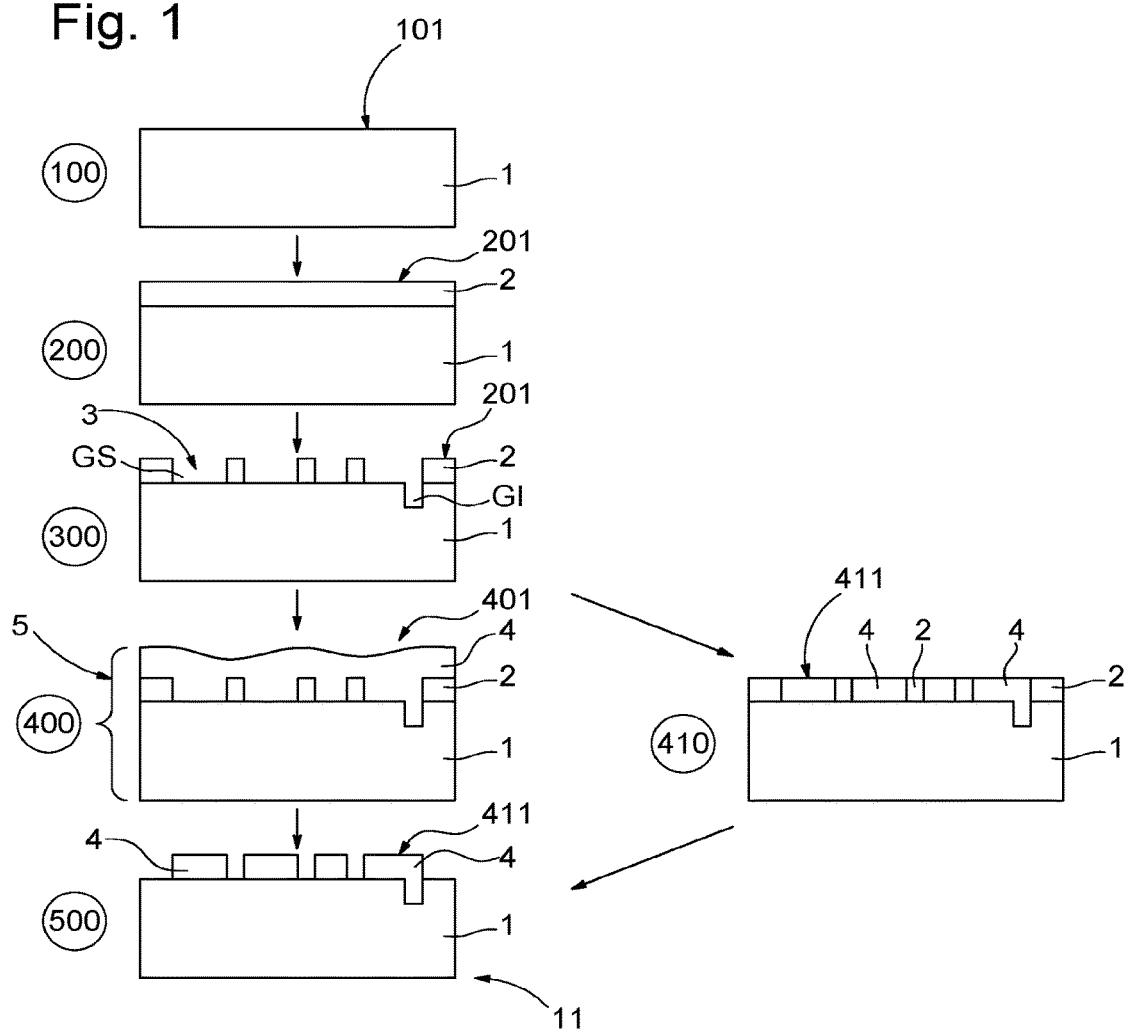
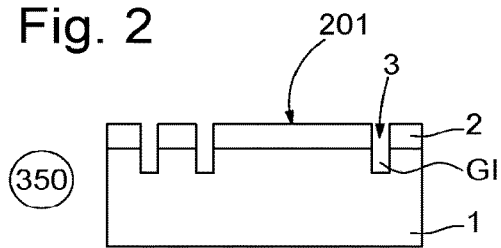
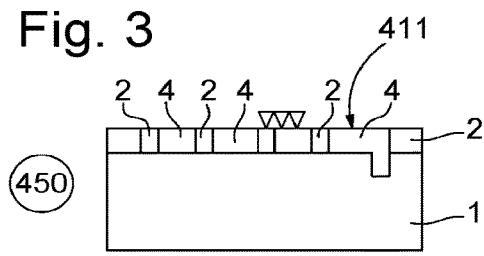
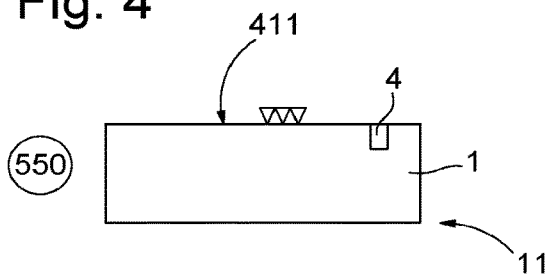

EXTERNAL ELEMENT OR DIAL FOR HOROLOGY OR JEWELLERY MADE OF CONDUCTIVE MATERIAL

CROSS-REFERENCE TO RELATED APPLICATION

This application claims priority to European Patent Application No. 19162928.6 filed on Mar. 14, 2019, the entire disclosure of which is hereby incorporated herein by reference.

FIELD OF THE INVENTION

The invention concerns a method for fabricating an external element or a dial for horology or jewellery made of conductive material.

The invention also concerns a watch including an external element and/or a dial made by this method.

The invention concerns the field of external or display components for horology, and the field of jewellery.

BACKGROUND OF THE INVENTION

To fabricate two-coloured components, there is a known method consisting in:
placing a sacrificial protective layer (photosensitive resin, varnish, adhesive, polymer film) over the entire surface of a blank;
selectively etching the protective layer, possibly also etching the substrate;
performing a decorative treatment (electroplating, vacuum deposition, varnish, lacquer);
removing the protective layer (chemical etching, dissolution, ion bombardment, mechanical action).

Unless photosensitive resin is used, the definition of contours is not very good.

Moreover, the material of the sacrificial protective layer may exhibit the phenomenon of degassing during any subsequent vacuum treatment, especially to perform the decorative treatment by a metallization process.

JP Patent Application No. H05156425A in the name of SEIKO EPSON Corp. discloses the formation of a hollow letter, or more generally a pattern, coated with a coloured film, on the surface of a base material, such as a sintered hard alloy, an alloy of platinum or of white gold, or ceramic, by a dry film formation process. The surface of the material is coated with a coloured film as first layer, a hollow pattern having a depth greater than the thickness of the first layer is formed on the part concerned by laser beam machining, the coloured film having a different composition from that of the first layer is applied as second layer by a dry film formation process, and then the first layer and second layer are removed, except from the area including the pattern.

JP Patent No. H04160154 in the name of SEIKO discloses an economical method for producing a decorative element with a decorative quality and stabilized quality by masking the surface of a stainless steel decorative element, machining the specified part with a laser beam to form a recessed pattern, and then forming a grey/black coating in the form of a film, particularly by ion plating. The masking film is then removed by etching. A recessed grey/black pattern or feature is thus efficiently formed with stabilized quality.

JP Patent No. H04136188 in the name of SEIKO discloses how to qualitatively and efficiently decorate a recessed gold character, by coating the surface of a stainless steel decorative element with a titanium-based film by ion plating, forming a recessed character on the desired part by laser beam machining, and then applying gold plating by electroplating before removing the film by etching.

EP Patent No. 3181006 in the name of THE SWATCH GROUP RESEARCH & DEVELOPMENT Ltd discloses an external element made of a first ceramic material having a first colour, the surface of this external element is at least partially treated such that it undergoes at least one transformation with a different colour from the first colour.

EP Patent No. 3336614 in the name of RUBATTEL AND WEYERMANN discloses a method for fabricating an external element or timepiece dial from non-conductive material, wherein a basic cycle including the following steps is performed at least once:
making a base from a non-conductive, or ceramic, or glass or sapphire substrate,
dry coating the base with at least a first sacrificial metal protection layer;
etching a decoration by means of an ultrashort pulse laser of the picosecond laser or femtosecond laser type, to a depth at least equal to the local thickness of the first sacrificial metal protection layer;
dry coating the decoration and the remaining part of the first sacrificial metal protection layer with at least a second metal and/or coloured decorative treatment layer;
chemically removing each first sacrificial metal protection layer.

EP Patent Application No. 3067220A1 in the name of ROLEX discloses a method for decorating a timepiece element, with deep etching of a surface of the element to be decorated using a femtosecond laser; and surface structuring the surface of the timepiece element to be decorated, these two decorations being at least partially superposed on one another.

SUMMARY OF THE INVENTION

The invention proposes to develop a method for fabricating an external element or a dial for horology or jewellery, made of conductive material, notably ceramic or similar, in order to obtain metallized and/or coloured etched decorations.

To this end, the invention concerns a method according to claim 1.

The invention also concerns a watch including an external element and/or a dial made by this method.

The proposed procedure makes it possible to obtain high definition decorations on conductive substrates.

Moreover, the invention obviates the use of organic protection layers which could exhibit degassing during a subsequent vacuum metallizing process.

Finally, the solution offered does not require the acquisition of expensive photolithography equipment (spin coater, mask aligner, yellow room), and can be performed with ordinary mechanical etching equipment, or more particularly, laser etching equipment.

BRIEF DESCRIPTION OF THE DRAWINGS

Other features and advantages of the invention will appear upon reading the following detailed description, with reference to the annexed drawings, in which:

FIG. 1 represents a schematic, sectional view of an operating sequence of a basic cycle of the method of the invention, including the making of a base, coating the latter with a first sacrificial metal protection layer, etching a decoration, depositing a second decorative metal and/or coloured treatment layer, and removing the first sacrificial metal protection layer.

FIG. 2 represents, in a similar manner to FIG. 1, the single etching step, in which all the etches reach the substrate of the base.

FIG. 3 represents, in a similar manner to FIG. 1, an optional step of mechanically levelling the first sacrificial metal protection layer and the second decorative treatment layer, before removing the first sacrificial metal protection layer.

FIG. 4 represents, in a similar manner to FIG. 3, an optional step of mechanically levelling the second decorative treatment layer, after removing the first sacrificial metal protection layer.

DETAILED DESCRIPTION OF PREFERRED EMBODIMENTS

Figure 5:
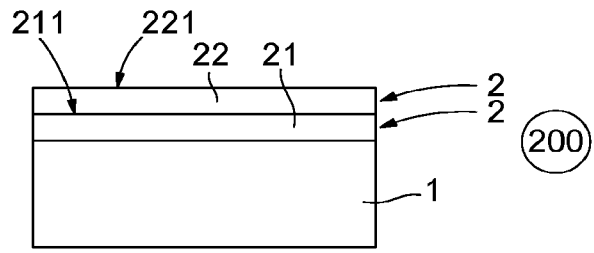
FIG. 5 represents, in a similar manner to FIG. 1, the single step of depositing a first sacrificial metal protection layer, with two superposed sacrificial metal protection layers.

The invention concerns a method for fabricating a timepiece component made of conductive material, notably an external element or dial, wherein a basic cycle is performed at least once, including, in this order, the following steps:
  in an initial step 100, producing a base 1 from a substrate made of conductive material, which is either metal or ceramic or organic or composite, defining an upper layer 101 of base 1;
  in a first coating operation 200, coating, in particular, but not exclusively, in a dry process, base 1 with at least a first layer 2 of a first sacrificial metal protection material;
  in a first etching operation 300, etching a first recessed decoration 3, to a depth at least equal to the local thickness of the first sacrificial metal protection layer 2, either mechanically or by means of an ultrashort pulse laser of the picosecond laser or femtosecond laser type;
  in a second coating operation 400, coating, in particular, but not exclusively, in a dry process, the first recessed decoration 3 and the remaining part of first sacrificial metal protection layer 2, with at least a second layer 4 of a second metal decorative treatment and/or coloured decorative treatment material, to form a first intermediate compound 5;
  in a first chemical removal operation 500, removing, particularly by chemical means, each first sacrificial metal protection layer 2, to obtain a first blank 10 comprising a first decoration formed by the remaining part of second layer 4, and making the timepiece component either directly in the form of first blank 10, or by finishing first blank 10.

More particularly, during the first coating operation 200, the coating is applied with a first thickness of more than 50 nanometres.

In a variant, during first coating operation 200, base 1 is dry coated with at least a first sacrificial metal protection layer 2. More particularly, the first dry coating is applied by PVD or CVD or ALD vacuum deposition.

In another variant, during first coating operation 200, base 1 is coated by electrolytic or electrochemical means with at least a first sacrificial metal protection layer 2.

More particularly, during the second coating operation 400 of coating with at least a second metal and/or coloured decorative treatment layer 4, the coating is applied with a second thickness comprised between 50 nanometres and 1,000 nanometres.

In a variant, during second coating operation 400, base 1 is dry coated with at least a second metal decorative treatment and/or coloured decorative treatment layer 4. More particularly, second dry coating operation 400 is applied by PVD or CVD or ALD vacuum deposition.

In another variant, during second coating operation 400, base 1 is coated by electrolytic or electrochemical means with at least a second metal decorative treatment and/or coloured decorative treatment layer 4.

In particular, during operation 300 of etching a first recessed decoration 3, etching is carried out everywhere down to the substrate of base 1.

More particularly, during first coating operation 200, the first coating is applied with a first thickness which is greater than or equal to the difference between, on one hand, a second thickness of a second metal and/or coloured decorative treatment layer 4 to be applied in step 4 of coating first recessed decoration 3 and the remaining part of first sacrificial metal protection layer 2, and on the other hand, the depth of etch in the substrate of base 1 during operation 300 of etching a first recessed decoration 3.

More particularly, during etching operation 300, etching is carried out to form a juxtaposition of deep conical or pyramidal recesses.

More particularly, during etching operation 300, etching is carried out to a depth in base 1 of between 20 nanometres and the total thickness of base 1.

In a variant, during first coating operation 200, the coating is at least partially applied in a dry process, or completely in a dry process, with the superposition of several first layers 2, 21, 22 of different types.

In another variant, during first coating operation 200, the coating is at least partially applied by electrolytic or electrochemical means, or completely by electrolytic or electrochemical means, with the superposition of several first layers 2, 21, 22 of different types.

In yet another variant, some of the layers are deposited in a dry process, and some other layers by electrolytic or electrochemical means.

Figure 6:
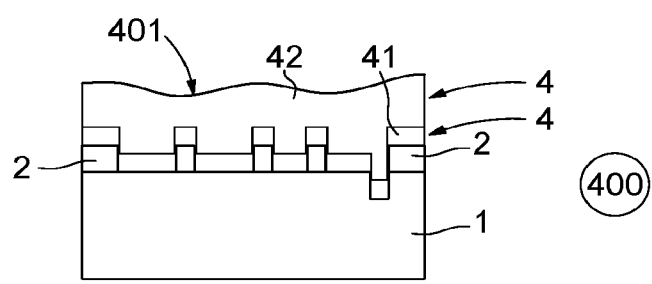
FIG. 6 represents, in a similar manner to FIG. 1, the single step of depositing a second metal and/or coloured decorative treatment layer, with two superposed decorative treatment layers.
Figure 7:
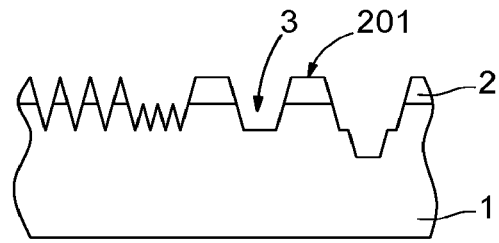
FIG. 7 represents an etching detail comprising single or superposed conical etches, and single or superposed pyramidal etches.
Figure 8:
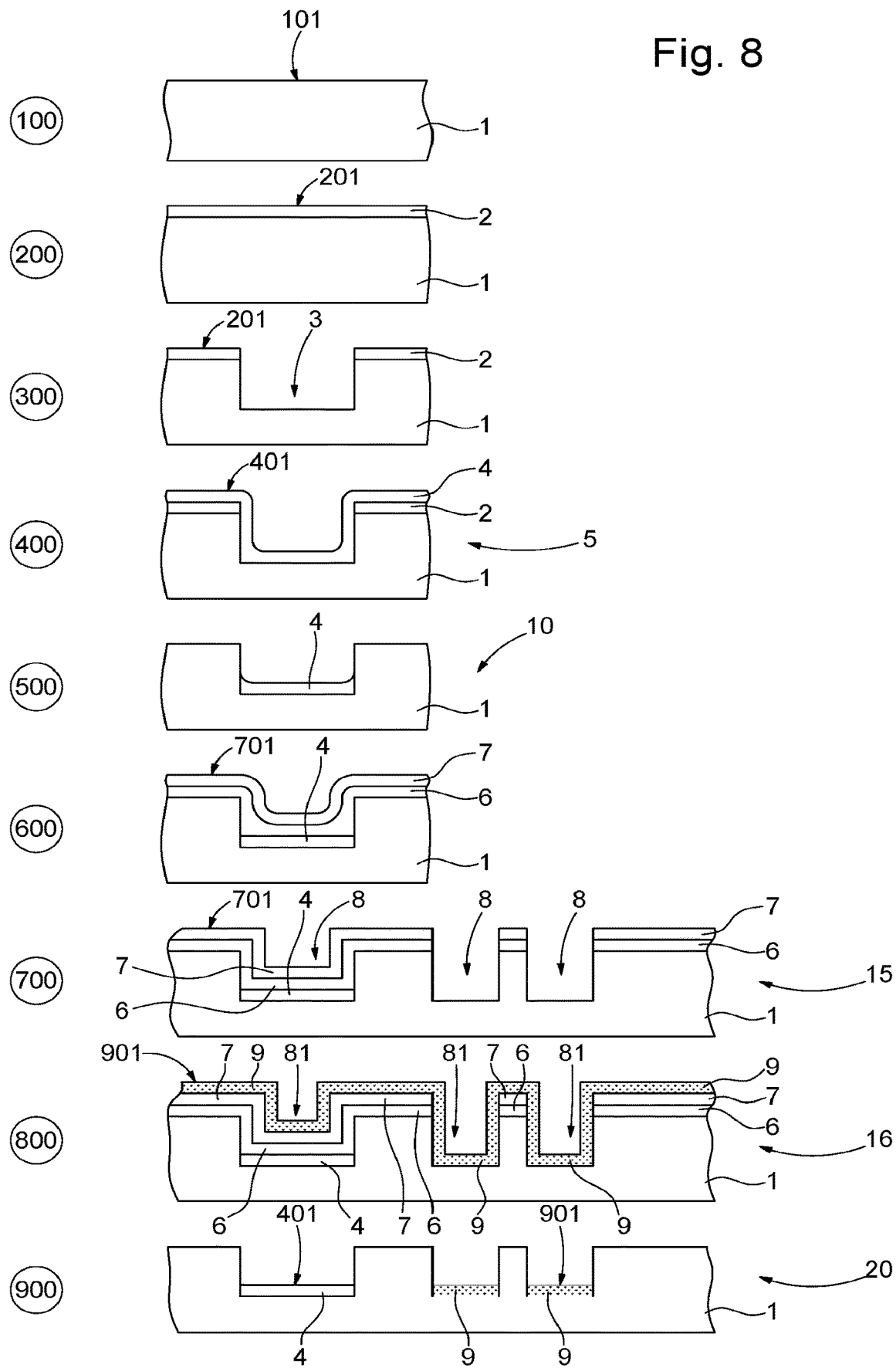
FIG. 8 represents, in a similar manner to FIG. 1, a sequence of nine operations for fabricating a component comprising two different decorations, wherein, in the first five operations a blank is successively made as in FIG. 1, and then this blank is coated, here in a particular variant firstly with a layer deposited in a dry process, then a layer deposited in an electrolytic or electroplating process, then a second hollow etch is made before the whole is coated with a superficial layer, and then the sacrificial metal protection layers are removed to reveal the decorations.
Figure 9:
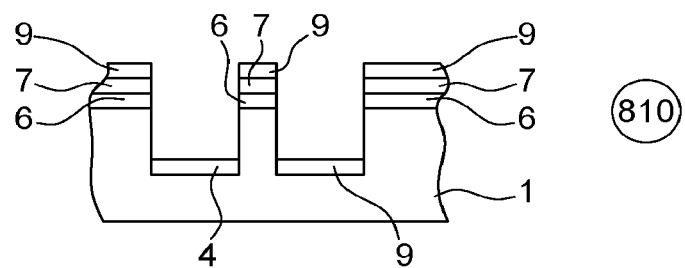
FIG. 9 represents, in a similar manner to FIG. 1, a variant of the second hollow etch of FIG. 8, wherein this etch is made with straight edges.
Figure 10:
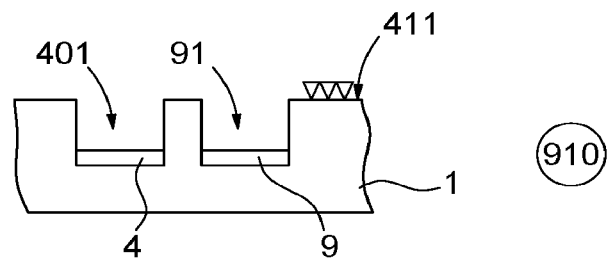
FIG. 10 represents, in a similar manner to FIG. 1, a variant of FIG. 9, with a levelling or polishing treatment of the final surface.
Figure 11:
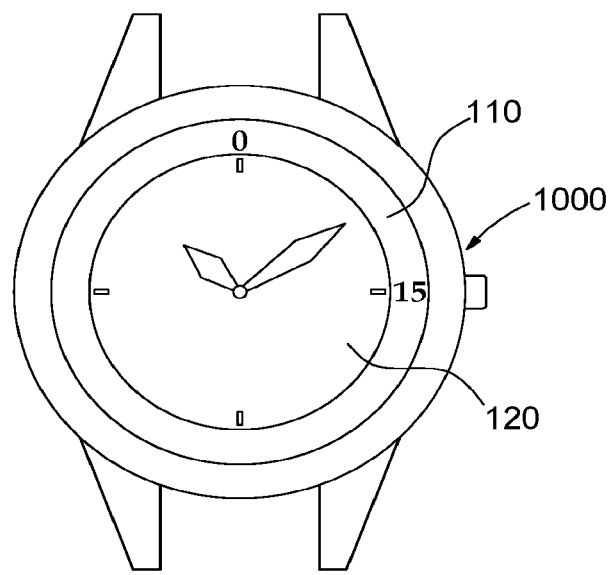
FIG. 11 represents a watch including a bezel and a dial made of ceramic, produced and decorated by the method of the invention.

In a particular variant, as seen in FIG. 6, in step 400 of coating recessed decoration 3 and the remaining part of first sacrificial metal protection layer 2 with at least a second metal and/or coloured decorative treatment layer 4, the coating is applied with the superposition of several second layers 4 of different types, 41, 42.

In a variant, during second coating operation 400, the coating is at least partially applied in a dry process, or completely in a dry process, with the superposition of several second layers 4, 41, 42 of different types.

In another variant, during second coating operation 400, the coating is at least partially applied by electrolytic or electrochemical means, or completely by electrolytic or electrochemical means, with the superposition of several second layers 4, 41, 42 of different types.

In yet another variant, some of the layers are deposited in a dry process, and some other layers by electrolytic or electrochemical means.

More particularly, several second layers 4, 41, 42 are superposed with at least a chromium layer 41 of 50 to 250 nanometres and a gold layer 42 of 50 to 150 nanometres. More particularly, a thick chromium layer of around 200 nanometres and a thick gold layer of around 100 nanometres are deposited in superposition.

FIG. 1 shows a variant 410, which is more difficult to realize, wherein operation 400 is modified by depositing the second decorative treatment layer level with first sacrificial metal protection layer 2.

For a particular application for making conductive, metallized and/or coloured etched dials, an advantageous operating sequence of the invention includes particular parameters:

200: depositing a sacrificial metal protection layer: preferably, but not exclusively, aluminium, or chromium, or copper. This sacrificial metal protection layer can be produced in a dry process, more particularly by PVD, CVD, ALD or similar; it can also be produced by electrolytic or electrochemical or other means.

300: laser etching the decoration, either with an ultrashort pulse laser (of the picosecond laser or femtosecond laser type) or with a nanosecond laser, or an attosecond laser at the other extreme, with selective ablation of sacrificial metal protection layer 2, and possibly etching of substrate 1, called lower etching GI, as seen in the Figures;

400: decorative metal (gold, rhodium, chromium, silicon or otherwise) or coloured (oxides, for example silicon dioxide, or corundum or otherwise, metal nitrides and carbides and any layer combination thereof) treatment, in a dry process, more particularly PVD, CVD, ALD or similar, or produced by an electrolytic or electrochemical treatment, or otherwise;

500: removal of the protection layer by chemical means (NaOH type alkaline solution for aluminium, but also possibly acid for chromium, or otherwise).

The choice of materials is directly defined by the constraints of the operating sequence.

Indeed, the nature of each sacrificial layer and that of each decorative layer must be chosen such that:
the stripping solution removes the protective layer without degrading the decorative coating;
the protective layer is not degraded during the etch, notably during a laser etch (particularly, but not exclusively, an ultrashort pulse laser of the picosecond laser or femtosecond laser type, but also nanosecond laser or otherwise), in places other than the defined etch area (possible degradation in proximity to the etch, projection of incandescent particles);
the protective layer must resist any intermediate cleaning operations.

The choice, in step 200, of a sacrificial metal protection layer avoids any degassing. Indeed, this sacrificial metal protection layer is composed of a material that is inert in the conditions of pressure (which may be as low as $P=1.10^{-8}$ mbar) and temperature (typically $T \leq 300°$ C.) encountered during the decorative treatment in step 400, unlike the lacquers/varnishes used in the prior art, which have the drawback, in these conditions, of degassing and/or partially decomposing, which could impair the quality and/or aesthetics of the decorative treatment.

Preferably, prior to performing step 200 of coating base 1 with at least a first sacrificial metal protection layer 2, a cleaning operation is performed: using detergent and/or solvent, with/without ultrasounds, with/without mechanical stress, with/without temperature, to ensure that the surface is clean and thus to ensure good adhesion of the sacrificial metal protection layer.

In a particular variant, during operation 300 of etching a recessed decoration 3, etching is carried out everywhere in the substrate of base 1, as seen in FIG. 2.

Naturally, the blank should be cleaned after the etching operation, before proceeding to the second deposition of decorative treatment material, notably by PVD or CVD or ALD. This is a conventional cleaning operation (using detergent and/or solvent, with/without ultrasounds, with/without mechanical stress, with/without temperature), but it must not degrade the sacrificial metal protection. In particular, in the case where the sacrificial metal protection contains aluminium, cleaning solutions with a pH level that is too basic must be excluded.

In a variant of the invention, before or after the chemical removal (in step 500) of each first sacrificial metal protection layer 2, the compound thus formed on the upper level of base 1 is mechanically levelled (in a step 550).

In a particular variant, after coating step 400, in which recessed decoration 3 and the remaining part of first sacrificial metal protection layer 2 are coated with at least a second metal and/or coloured decorative treatment layer 4, the compound thus formed on the upper level of first sacrificial metal protection layer 2 is mechanically levelled in a step 450.

In another particular variant, prior to the chemical removal 500 of each first sacrificial metal protection layer 2, the compound thus formed on the upper level of base 1 is mechanically levelled in step 550.

In another particular variant, after the chemical removal 500 of each first sacrificial metal protection layer 2, the compound thus formed on the upper level of base 1 is mechanically levelled in step 550.

In a variant, in step 200 of coating base 1 with at least a first sacrificial metal protection layer 2, this dry coating is applied by PVD or CVD or ALD vacuum deposition; various methods may also be suitable: vacuum evaporation, vacuum sputtering, PECVD or otherwise. In another variant, this coating is applied by electrolytic or electrochemical means.

In a particular variant, in step 200 of coating base 1 with at least a first sacrificial metal protection layer 2, this coating is applied with a first thickness of more than 50 nanometres.

In an advantageous variant, in step 400 of coating recessed decoration 3 and the remaining part of first sacrificial metal protection layer 2 with at least a second metal and/or coloured decorative treatment layer 4, this coating can be applied in a dry process, particularly by PVD vacuum deposition (different methods may be suitable: vacuum evaporation, vacuum sputtering, CVD, ALD, or otherwise), or by electrolytic or electrochemical means.

More specifically, in step 400 of coating recessed decoration 3 and the remaining part of first sacrificial metal protection layer 2 with at least a second metal and/or coloured decorative treatment layer 4, this coating is applied with a second thickness comprised between 50 nanometres and 2,000 nanometres, more particularly between 50 nanometres and 1,000 nanometres.

Preferably, in step 200 of coating base 1 with at least a first sacrificial metal protection layer 2, the coating is applied with a first thickness which is greater than or equal to the difference between, on the one hand, a second thickness of a second metal and/or coloured decorative treatment layer 4 in step 400 of coating recessed decoration 3 and the remaining part of said first sacrificial metal protection layer 2, and on the other hand, the etch depth in the substrate of base 1 during operation 30 of etching a recessed decoration 3.

In an advantageous variant, in step 30 of etching a recessed decoration 3, to a depth at least equal to the local thickness of first sacrificial metal protection layer 2, etching is carried out mechanically or by means of a laser, especially a nanosecond, picosecond or femtosecond laser.

As an alternative to the invention, in a similar procedure, it is possible to carry out this etch by different means, alone or in combination: laser, tool machining, ion bombardment, chemical etching, or suchlike.

In a particular variant, in step 300 of etching a recessed decoration 3 to a depth at least equal to the local thickness of first sacrificial metal protection layer 2, etching is carried out to form a juxtaposition of deep conical or pyramidal recesses.

More particularly, this etch 300 is carried out to a depth in base 1 comprised between 20 nanometres and the total thickness of base 1.

Thus, it is possible, for example, to make a very deep conical recess over the entire thickness of a dial, for example over a thickness on the order of a millimetre.

More particularly, for other applications, notably display applications, a substantially flat laser etch is carried out, to a depth of around 20 μm.

In another variant, a deeper laser etch is carried out, for example to define a recess, or a bevelled date aperture or similar. The invention can produce a very fine, two-coloured, bevelled aperture, which is extremely difficult to make by other means.

In a particular variant, as seen in FIG. 5, in step 200 of coating base 1 with at least a first sacrificial metal protection layer 2, the coating is applied with the superposition of several first layers 2 of different types 21, 22.

The choice of materials that can be used is quite wide:
- for the conductive substrate, many different materials can be used;
- for the sacrificial metal protection, for example, aluminium or chromium:
    - for a sacrificial metal protection containing aluminium, a decorative treatment may include: Au, Cr, Rh, Ti, Si, and/or alloys and/or oxides and/or nitrides and/or carbides and/or combinations of these metals;
    - for a sacrificial metal protection containing chromium, a decorative treatment may include: Au, Rh, Ti, Si, and/or alloys and/or oxides and/or nitrides and/or carbides and/or combinations of these metals;

In a variant, after the first chemical removal operation 500, in a third coating operation 600, the first blank 10 is coated, in an electroplating process, with at least a surface layer 7 of the first sacrificial metal protection material or of another sacrificial metal protection material. The electroplating process must, however, be applied to a conductive substrate.

In another variant, after the first chemical removal operation 500, in a third coating operation 600, the first blank 10 is coated in a dry process, more particularly by PVD, CVD, ALD or similar, with at least a third layer 6 of the first sacrificial metal protection material or with another sacrificial metal protection material. This coating mode is independent of the nature of the substrate.

In yet another variant, during coating operation 600, once such a third layer 6 has been created, third layer 6 is then coated, in an electroplating process, with at least a surface layer 7 of the first sacrificial metal protection material, or of the sacrificial metal protection material of third layer 6, or of another sacrificial metal protection material. Choosing a conductive third layer 6 makes it possible to apply the electroplating method for forming surface layer 7. There is nothing to prevent the material of third layer 6 being the same as that of surface layer 7, for example copper.

More particularly, after third coating operation 600, a second etching operation 700 is performed, in which a second recessed decoration 8 is etched, mechanically or by means of a laser, to a depth at least equal to the combined thickness of the layers deposited during third coating operation 600 on first blank 10, to produce a second intermediate compound 15.

More particularly still, after this second etching operation 700, a fourth coating operation 800 is performed, during which second recessed decoration 8 and the outermost surface of the second intermediate compound 15 are coated with at least a fifth layer 9 of a fifth metal and/or coloured decorative treatment material, to obtain a third intermediate compound 16.

More particularly still, after this fourth coating operation 800, a second chemical removal operation 900 is performed, in which every sacrificial metal protection layer is removed by chemical means, to obtain a second blank 20 comprising the first decoration formed by the remaining part of second layer 4, and a second decoration formed by the remaining part of fifth layer 9, and the timepiece component is either made directly in the form of this second blank 20, or by finishing second blank 20.

More particularly, before or after an operation of chemically removing a sacrificial metal protection layer, a mechanical levelling operation 550 or 910 is performed, during which the compound thus formed is mechanically levelled on upper level 101 of base 1, or under this upper level 101, to form a decorative visible surface on upper level 411 of the remaining part of the component. Thus, after completion of the first basic cycle and cleaning, at least one other basic cycle is carried out with modified parameters for the etching operation and/or for the choice of decorative treatment.

More particularly, after fourth coating operation 800 and before second chemical removal operation 900, an intermediate etching operation 810 is performed, during which a third recessed decoration 81 is etched, either mechanically or by means of a laser.

More particularly, before or after an operation of chemically removing a sacrificial metal protection layer, a mechanical levelling operation 550 or 910 is performed, during which the compound thus formed is mechanically levelled on upper level 101 of base 1, or under this upper level 101, to form an decorative visible surface on upper level 411 of the remaining part of the component. Thus, after completion of the first basic cycle and cleaning, at least one other basic cycle is carried out with modified parameters for the etching operation and/or for the choice of decorative treatment.

The invention is particularly well suited to the preferred case wherein, in step 100 of making base 1, a ceramic substrate is used.

More particularly, at least one sacrificial metal protection material is used, which is copper or aluminium or gold or platinum.

More particularly, the timepiece component is fabricated to form an external element or a dial.

Thus, more particularly, the method according to the invention is well suited to the fabrication of an external element such as a case, a bezel, a flange or a dial for horology or jewellery, or a jewellery component, for example an element of a bracelet or jewel, made of conductive material, notably ceramic or similar, making it possible to obtain metallized and/or coloured etched decorations.

The invention makes it possible to make two-coloured or multi-coloured components.

Indeed, the method can be iterated, with different etched decorations and/or different decorative treatments.

Thus, after execution of phase 500 and completion of a first basic cycle, and after cleaning, at least one other basic cycle can be performed with modified parameters for the etching operation and/or for the choice of decorative treatment.

It is thus possible, without limiting the number of iterations, to recommence the entire operating sequence of the basic cycle with modified parameters, by:
- depositing the sacrificial metal protection;
- etching another decoration, for example elsewhere on the substrate and/or partially on an etch already carried out in a previous phase;
- depositing another decorative treatment;
- dissolving the sacrificial metal protection.

This cycle can be repeated several times to obtain multicoloured components, for example, having parts with a different appearance made of Au, Ti, Si, Rh or otherwise.

A particular etched texture can also provide a particular visual appearance, depending on the roughness, density and etch depth, which produce reflections, or a particular finish of the decorative treatment applied, for example, satin, semi-matt, brilliant or otherwise.

The invention also concerns a watch 1000, which includes an external element 110, such as a bezel, case or similar, notably made of ceramic, and/or which includes a dial 120, notably made of ceramic, made by the method according to the invention.

This procedure obviates the use of expensive photolithography equipment to obtain very high definition decorations.

Moreover, the use of a sacrificial metal protection layer avoids any problematic degassing during the preferred vacuum treatment for application of the metal and/or coloured decorative treatment layer.

The invention lends itself well to the decoration of conductive dials, conductive crystals, conductive components like watch cases, case middles, bezels, crowns and otherwise. The quality, finesse and contrast of the decorations, which can be made of precious metals, allow for highly refined decoration, compatible with luxury watches, and notably the decoration of elements for complications, such as, for example, high resolution moon phase indicators. The reasonable cost of implementing the method also permits the use thereof in more widely used timepiece components.

Naturally, the invention is advantageous, not only for horology or jewellery components, but also for jewels or jewellery components, or spectacles or fashion items.

Indeed, the invention makes it possible to change and substantially enhance the appearance of components directly visible to the user, with innovative decorations, and contributes to promotion of the brand and product. More particularly, the invention can be used for identification marking and/or anti-counterfeiting marking.

The invention claimed is:

1. A method for fabricating a timepiece component made of conductive material, wherein a basic cycle is performed at least once, comprising, in this order, the following steps:
   - in an initial step, producing a base from a substrate made of conductive material, which is either metal or ceramic or organic or composite, defining an upper layer of said base;
   - in a first coating operation, coating said base with at least a first layer of a first sacrificial metal protection material;
   - in a first etching operation, etching a first recessed decoration, to a depth at least equal to the local thickness of said first sacrificial metal protection layer, either mechanically or with an ultrashort pulse laser of the picosecond laser or femtosecond laser type;
   - in a second coating operation, coating said first recessed decoration and a remaining part of said first sacrificial metal protection layer with at least a second layer of a second metal decorative treatment and/or coloured decorative treatment material, to form a first intermediate compound;
   - in a first chemical removal operation, removing by chemical means the remaining part of the first sacrificial metal protection layer, to obtain a first blank comprising a first decoration formed by a remaining part of said second layer; and
   - making said timepiece component either directly in the form of said first blank, or by finishing said first blank, wherein:
     - either during said first coating operation, or respectively during said second coating operation, said coating is at least partially applied in a dry process or at least partially by electrolytic or electrochemical means, with the superposition of several said first layers, or respectively of several said second layers of different types;
   - the method further comprises:
   - after said first chemical removal operation, in a third coating operation, coating said first blank with a third layer comprising a surface layer of said first sacrificial metal protection material or of another sacrificial metal protection material followed by coating the third layer with a fourth layer comprising a surface layer of said first sacrificial metal protection material or of another sacrificial metal protection material;
   - in a second etching operation, etching a second recessed decoration to a depth at least equal to a thickness of the third and fourth layers;
   - in a fourth coating operation, coating the second recessed decoration and the fourth layer with a fifth layer of a fifth metal decorative treatment and/or coloured decorative treatment material;

in a second chemical removal operation, removing the third layer, fourth layer and part of the fifth layer to leave a remaining portion of the fifth layer in the second recessed decoration.

2. The method according to claim 1, wherein, during said first coating operation, said coating is applied with a first thickness of more than 50 nanometres.

3. The method according to claim 1, wherein, during said first coating operation, said base is dry coated with at least one said first sacrificial metal protection layer.

4. The method according to claim 3, wherein said first dry coating is applied by PVD or CVD or ALD vacuum deposition.

5. The method according to claim 1, wherein, during said second coating operation of coating with at least a second metal and/or coloured decorative treatment layer, said coating is applied with a second thickness comprised between 50 nanometres and 1,000 nanometres.

6. The method according to claim 1, wherein, during said second coating operation, said base is dry coated with at least said second metal decorative treatment and/or coloured decorative treatment layer.

7. The method according to claim 6, wherein said second dry coating operation is carried out by PVD or CVD or ALD vacuum deposition.

8. The method according to claim 1, wherein, during said operation of etching a said first recessed decoration, said etching is carried out everywhere down to said substrate of said base.

9. The method according to claim 1, wherein, during the first coating operation, said first coating is applied with a first thickness which is greater than or equal to the difference between, on the one hand, a second thickness of a second metal and/or coloured decorative treatment layer to be applied during the step of coating said first recessed decoration and said remaining part of said first sacrificial metal protection layer, and on the other hand, the etch depth in the substrate of said base during said operation of etching a first recessed decoration.

10. The method according to claim 1, wherein, during said etching operation, said etching is carried out to form a juxtaposition of deep conical or pyramidal recesses.

11. The method according to claim 1, wherein, during said etching operation, said etching is carried out to a depth in said base comprised between 20 nanometres and the total thickness of said base.

12. The method according to claim 1, wherein, during said first coating operation, said coating is at least partially applied in a dry process, or completely in a dry process, with the superposition of several said first layers of different types.

13. The method according to claim 1, wherein, during said second coating operation, said coating is at least partially applied in a dry process, or completely in a dry process, with the superposition of several said second layers of different types.

14. The method according to claim 13, wherein said superposition of several said second layers is carried out with at least a chromium layer of 50 to 250 nanometres and a gold layer of 50 to 150 nanometres.

15. The method according to claim 13, wherein said superposition of several said second layers is carried out with at least a chromium layer of about 200 nanometres and a gold layer of about 100 nanometres.

16. The method according to claim 1, wherein the third coating operation comprises a dry process.

17. The method according to claim 1, wherein the second etching operation is performed wherein the second recessed decoration is etched, mechanically or with a laser to produce a second intermediate compound.

18. The method according to claim 1, wherein, after said second chemical removal operation is performed, a second blank is obtained comprising said first decoration formed by the remaining part of said second layer, and a second decoration formed by the remaining part of said fifth layer, and wherein said timepiece component is either made directly in the form of said second blank, or by finishing said second blank.

19. The method according to claim 18, wherein at least a sixth metal decorative treatment and/or coloured decorative treatment material is chosen, and wherein a sequence combining said third coating operation, said second etching operation, and said second chemical removal operation is reiterated, with the same sacrificial metal protection materials or other similar sacrificial metal protection materials, in order to make at least one other decoration in addition to said first decoration and said second decoration.

20. The method according to claim 1, wherein, after said third coating operation and before said second chemical removal operation, an intermediate etching operation is performed, during which a third recessed decoration is etched, either mechanically or with a laser.

21. The method according to claim 1, wherein, before or after an operation of chemically removing a sacrificial metal protection layer, a mechanical levelling operation is performed, during which the compound thus formed is mechanically levelled on said upper level of said base, or under said upper level, to form a decorative visible surface on the upper level of a remaining part of said component.

22. The method according to claim 1, wherein, following completion of a first said basic cycle and a cleaning operation, at least one more said basic cycle is performed with modified parameters for said etching operation and/or for the choice of said decorative treatment.

23. The method according to claim 1, wherein, during the step of making said base, a ceramic substrate is used.

24. The method according to claim 1, wherein at least one sacrificial metal protection material is used, which is copper or aluminium or gold or platinum.

25. The method according to claim 1, wherein said timepiece component is fabricated to form an external element or a dial.

26. The method according to claim 1, wherein, during said first coating operation, said base is coated by electrolytic or electrochemical means with at least one said first sacrificial metal protection layer.

27. The method according to claim 1, wherein, during said second coating operation, said base is coated by electrolytic or electrochemical means with at least one said second metal decorative treatment and/or coloured decorative treatment layer.

28. The method according to claim 1, wherein, during said first coating operation, said coating is at least partially applied by electrolytic or electrochemical means, or completely by electrolytic or electrochemical means, with the superposition of several said first layers of different types.

29. The method according to claim 1, wherein, during said second coating operation, said coating is at least partially applied by electrolytic or electrochemical means, or completely by electrolytic or electrochemical means, with the superposition of several said second layers of different types.

30. The method according to claim 1, wherein the third coating operation comprises an electroplating process.

31. The method according to claim 16, wherein, during said third coating operation, after creating said third layer, said third layer is then coated, in an electroplating process, with the fourth layer.

32. A watch comprising at least one timepiece component made by the method according to claim 1.

* * * * *